United States Patent [19]

Law et al.

[11] Patent Number: 4,686,396

[45] Date of Patent: Aug. 11, 1987

[54] MINIMUM DELAY HIGH SPEED BUS DRIVER

[75] Inventors: Simon M. Law, Torrance; Thien M. Ngo, Panorama City, both of Calif.

[73] Assignee: Xerox Corporation, Stamford, Conn.

[21] Appl. No.: 769,520

[22] Filed: Aug. 26, 1985

[51] Int. Cl.⁴ .................. H03K 19/02; H03K 17/687; H03K 17/56

[52] U.S. Cl. .................. 307/473; 307/270; 307/246; 307/571

[58] Field of Search .............. 307/270, 475, 473, 448, 307/583, 242, 243, 482, 577, 572

[56] References Cited

U.S. PATENT DOCUMENTS

| | | | |
|---|---|---|---|
| 3,922,566 | 11/1975 | Kodama et al. | 307/583 |
| 4,029,971 | 6/1977 | Pryor | 307/270 |
| 4,280,065 | 7/1981 | Mihato et al. | 307/473 |
| 4,417,162 | 11/1983 | Keller et al. | 307/473 |
| 4,504,745 | 3/1985 | Spence et al. | 307/473 |

FOREIGN PATENT DOCUMENTS 0000656 1/1980 Japan .................. 307/473

Primary Examiner—Stanley D. Miller
Assistant Examiner—B. P. Davis
Attorney, Agent, or Firm—Franklyn C. Weiss

[57] ABSTRACT

A minimum delay, high speed, tri-state bus driver is utilized to couple data and control signals to a memory bus with a minimum amount of buffering. Two transistors 24, 26, utilized in a bootstrap configuration, deliver a system clock to the gate terminals of output transistors 28, 30 which are coupled to the memory bus 40. The input data signals and accompanying control signals are applied to these bootstrap transistors 24, 26 via push-/pull amplifiers 20, 22 and, depending on the data level of the input data signal, either a logic 1, a logic 0, or a high impedance open circuit is applied to the bus.

5 Claims, 1 Drawing Figure

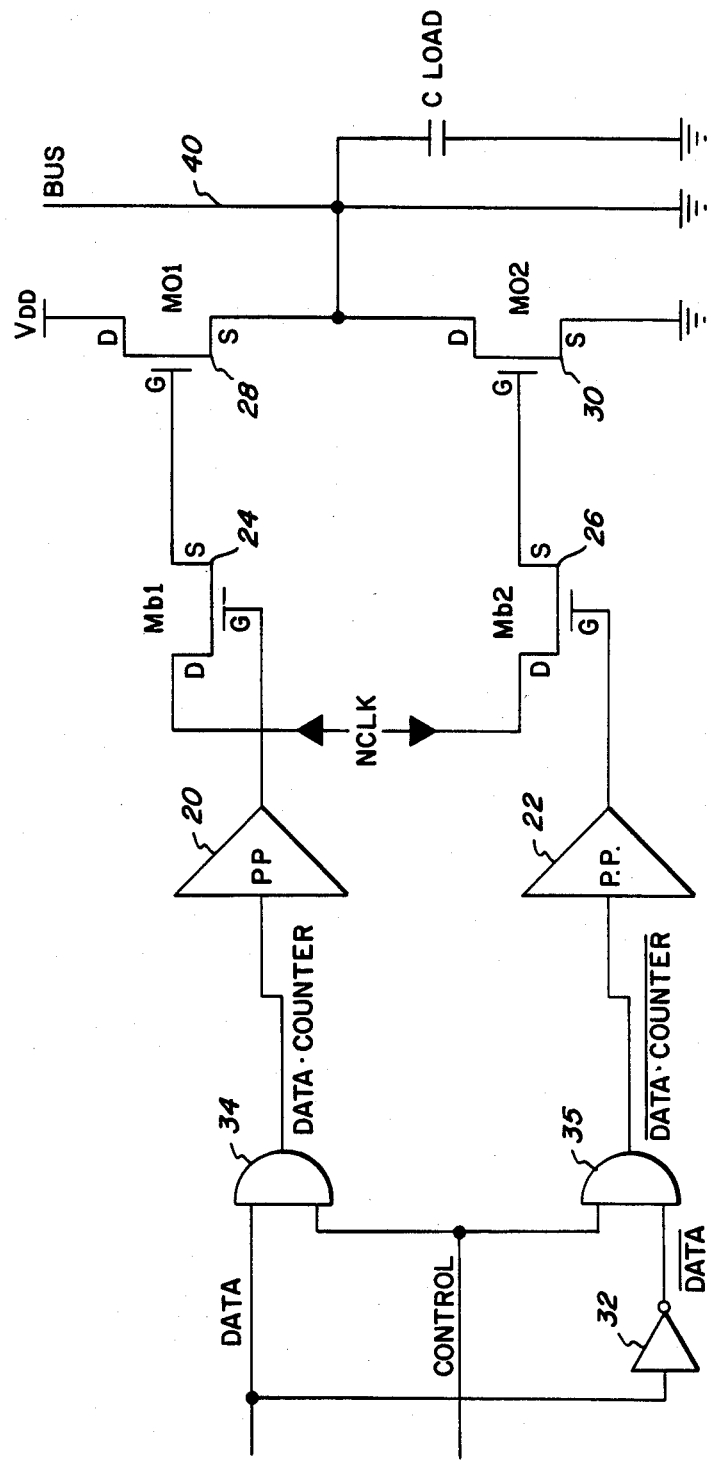

MINIMUM DELAY HIGH SPEED BUS DRIVER

This invention relates to a tri-state bus driver which minimizes the number of delay stages from the input data signal to the memory bus which it drives.

BACKGROUND OF THE INVENTION

In order to drive a large bus load on an integrated circuit chip, generally three or more levels of buffering are needed because of the relatively large load the bus presents to the driving circuit. The data enabling signal must be synchronized with the system clock. A transistor-transistor-logiq (TTL) compatible clock applied to a pad with a protection device is the most common way of inputting a clock signal into a VLSI integrated circuit chip. This clock signal will go through two or more levels of buffering to obtain the metal oxide semiconductor (MOS) logic level and driving capability. However, each additional stage of buffering induces an additional delay and slows down the bus driver.

According to the present invention, a minimum delay high speed tri-state bus driver is utilized to couple the data and control signals to the memory bus with a minimum amount of buffering. Two transistors, utilizing the bootstrap configuration, deliver the system clock to the gates of the output transistors which are coupled to the memory output bus. The input data signal and accompanying control signals are applied to these bootstrap transistors and, depending on the data level of the input data signal, either a logic 1, a logic 0, or a high impedance open circuit is applied to the bus.

DESCRIPTION OF THE DRAWINGS

For a more complete understanding of the invention, reference may be had to the following detailed description of the invention in conjunction with the drawing wherein the FIGURE is a schematic diagram of the minimum delay high speed bus driver in accordance with the principles of the present invention.

DETAILED DESCRIPTION OF THE INVENTION

The FIGURE shows the minimum delay high speed bus driver to be hereinafter described in detail. The bus that is being driven is shown on the right hand side of the Figure. A capacitance, Cload, is shown but it is not an actual circuit component, shown schematically as the representative impedance of the bus line. Output transistors Mo1 (28) and Mo2 (30) present to the bus line three distinct states. When transistor 28 is switched on, voltage Vdd-Vt is presented to the bus as a logic or binary 1. When transistor 30 is switched on, a ground potential or logic or binary 0 is presented to the bus. When neither transistor 28 nor transistor 30 are on, neither voltage Vdd nor ground are presented to the bus, effectively indicating an open circuit or high impedance state. Thus, the output transistors 28 and 30 present to the bus a tri-state signal level of binary 1, binary 0, and an open circuit or high impedance output.

Coupled to the MOS transistors 28 and 30 are bias transistors Mb1 (24) and Mb2 (26) which present the enabling signals to the output transistors 28 and 30, respectively. Thus, when the clock signal designated in the Figure as N clock (NCLK) is applied to bias transistor 24, at the same time the same clock signal is applied to the input of bias transistor 26, depending upon which of transistors 24 or 26 is mutually exclusively applied to transistors 24 or 26, these transistors are switched on and the N clock signals are applied either to transistor 28 or transistor 30, respectively, thereby presenting to the output bus either voltage Vdd-Vt or ground potential. Vt is the threshold voltage of the transistor. The data/control signal is applied to the transistor 24 and transistor 26 via push/pull buffers 20 and 22 respectively. Coupled to the inputs of the push/pull buffers 20 and 22, are AND gates 34 and 35 which receive the data, inverted data, and system control signals. The inverted data is obtained via inverter 32.

In operation, data will be generated by circuitry preceding this output bus driver circuit. This data, which is in the form of a two-state logic signal, would be applied to one input of AND gates 34 and 35. If the system decides that it is time to transmit this data, a control signal will be applied to the other input of AND gates 34 and 35. This will allow the data that is being received at the first input of the AND gates to be transferred through the AND gates due to the logical function thereof. If the data signal is a logic 1, then push/pull buffer 20 drives the signal and presents it to the input gate of bias transistor 24. This switches the transistor on and allows the N clock signal being applied to the other input terminal (drain) of transistor 24 to be presented to the gate terminal of transistor 28. The input clock signal is a signal of predetermined time duration so that the digital signals being applied to the output gate 28 are uniform within the entire integrated circuit. When transistor 28 is turned on due to the logic 1 level of the input data being transferred through the system to transistor 28, voltage level Vdd-Vt is applied to the output bus as a binary 1 signal. The disclosed circuit allows the use of a clock signal having a voltage equal to or above Vdd with no buffering as opposed to the normal TTL compatible voltage with two or three levels or stages of buffering.

When the input data signal becomes a logic 0, this signal is applied to inverter 32 which energizes or enables push/pull buffer 22 via AND gate 35. This assumes, of course, that the control signal to the other input of AND gate 35 is a logic 1 or at its enabling level. The signal is driven and presented to the input gate of bias transistor 26. Transistor 26 is thus enabled or turned on, and allows the application of the clock signal, which is indicated as the not clock signal by the NCLK designation in the Figure, is presented to the input gate terminal of output transistor 30. Since the input data is either a logic 0 or a logic 1, both output transistors 28 and 30 cannot be turned on at the same time. Thus, when the signal is applied the gate of transistor 30, the transistor is switched on and the ground potential applied to the source terminal of transistor 30 is thusly applied to the output bus line 40 as shown in the Figure.

When the system decides for some reason not to allow data to be transferred at that particular time, the control input signal to AND gates 34 and 35 would not be present. When the control signal is at 0 logic level, neither output transistors 28 or 30 are switched on, and thus a high impedance or open circuit is applied to the output bus. Other circuits of similar nature reproduced on the integrated circuit could be presenting data to the line at their respective times but when no control signal is applied to gates 34 and 35, this particular circuit at this particular time does not apply data to the output bus line.

Thus, when no clock signal, that is, at low level, or input control signal, that is, at low logic level, is received to the circuit, the output impedance will be high indicating an open circuit. When the control signal is present and the data input signal is at a logic 1, and the NCLK signal is present, then a digital 1 will be presented to the bus in the form of a Vdd-Vt volt signal. When the control signal is present at AND gates 34 and 35 and the clock signals are applied to transistors 24 and 26, but the input data signal is a logic 0, then only transistor 30 will be enabled thereby applying the ground potential to the output bus. Thus, the driver circuit of the present invention achieves a minimum delay by paying the price of requiring an external MOS compatible clock driver and a short moment of unconditional tri-state after every drive cycle. An MOS compatible external clock driver which provides a delay free clock signal for the whole chip is not only useful for the bus driver, but is also applicable to the rest of the chip for improving its performance. Such a requirement is the only way to provide the clock signal for the future high performance VLSI chips. A short moment of unconditional tri-state, that is, a high impedance output, between every drive cycle is desirable when the bus is changing procession, because bus contention problems can be avoided. This short moment would not be wasted because this short moment will be used for data changing purposes in any event.

While the invention has been described with reference to a specific embodiment, it will be understood by those skilled in the art that various changes may be made and equivalents may be substituted for elements thereof without departing from the true spirit and scope of the invention. In addition, many modifications may be made without departing from the essential teachings of the invention.

What is claimed is:

1. An integrated circuit tri-state bus driver circuit comprising:
    a first MOS transistor (28) with drain, gate, and source electrodes, whose source is connected to an output terminal, which output terminal is connected to the bus to be driven, and whose drain is connected to a voltage source,
    a second MOS transistor (30) with drain, gate, and source electrodes, whose source is connected to ground potential and whose drain is connected to said output terminal,
    a third MOS transistor (24) with drain, gate, and source electrodes, whose source is connected to the gate of said first transistor (28),
    a fourth MOS transistor (26) with drain, gate, and source electrodes, whose source is connected to the gate of said second transistor (30),
    the drains of said third and fourth transistors being connected to a system clock signal,
    a first buffer (20) with an input and an output, whose output is connected to the gate of said third transistor (24),
    a second buffer (22) with an input and an output, whose output is connected to the gate of said fourth transistor (26),
    the input to said first buffer (20) being connected to a source of two level binary data signals, and the input to said second buffer (22) being connected to a source of two level binary data signals complementary to said binary data signals connected to the input of said buffer (20),
    said source of two level binary data signals including a first AND gate (34) whose output is connected to the input of said first buffer (20) and which has first and second inputs, said first input being connected to said source of binary data signals, and said second input being connected to a source of data enable control signals.

2. The bus driver circuit as set forth in claim 1 further including a second AND gate (35) whose output is connected to the input of said second buffer (22) and which has first and second inputs, said first input being coupled to said source of binary data signals via an inverter circuit (32), and said second input of said second buffer (22) being connected to said source of data enable control signals.

3. The bus driver circuit as set forth in claim 2 wherein said first and second buffers (20,22) are of the push-pull operating type.

4. A tri-state integrated circuit bus driver circuit comprising
    first and second complementary output MOS transistors (28, 30) coupled to an output terminal, which output terminal is connected to said bus to be driven, said first transistor (28) being connected to a voltage supply source, and said second transistor being connected to ground, such that said output terminal, upon selective enabling of said output transistors, will have switched on it the voltage supply source, the ground potential, or open circuit condition which comprise said tri-state signal,
    first and second bootstrap MOS transistors (24, 26) connected to said first and second output transistors (28, 30), respectively, and also connected to a common system clock signal, such that when said first bootstrap transistor (24) is enabled, said first output transistor (28) is also enabled thereby conducting said voltage supply source to said output terminal, and when said second bootstrap transistor (26) is enabled, said second output transistor (30) is also enabled thereby conducting said ground potential to said output terminal, and when neither bootstrap transistors (24, 26) are enabled, neither output transistors (28, 30) are conducting and an open circuit, or high impedance, is presented to said output terminal,
    first and second buffers (20, 22) connected to said first and second bootstrap transistors (24, 26), said buffers being connected to a source of binary data signals and their complementary binary data signals, respectively, such that when binary data is transferred to said first and second bootstrap transistors (24, 26), the output signals at said output terminal will be said tri-state digital signals of duration and period dependent on the duration and period of said system clock signal.

5. The bus driver circuit as set forth in claim 4 further including
    a first AND gate (34) whose output is connected to said first buffer (20) and a second AND gate (35) whose output is connected to one input of said first and second AND gates (34, 35) respectively, and a data control signal connected to another input of both said AND gates (34, 35) such that said binary data signals or their complementary are transferred to said first and second buffers (20, 22) only upon enabling of said AND gates (34, 35) by said data control signal, the output on said bus being a tri-state signal comprising a digital one, a digital zero, or a no signal, high impedance state.

* * * * *